(12) United States Patent
Muraki et al.

(10) Patent No.: US 6,835,937 B1
(45) Date of Patent: Dec. 28, 2004

(54) CORRECTING METHOD FOR CORRECTING EXPOSURE DATA USED FOR A CHARGED PARTICLE BEAM EXPOSURE SYSTEM

(75) Inventors: Masato Muraki, Tokyo (JP); Yoshikiyo Yui, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 17 days.

(21) Appl. No.: 09/708,590

(22) Filed: Nov. 9, 2000

(30) Foreign Application Priority Data

Dec. 13, 1999 (JP) .......................... 11-353484

(51) Int. Cl.$^7$ ............... G01T 1/00; A61N 5/00; G21K 5/10
(52) U.S. Cl. ............... 250/396 R; 250/492.21; 250/492.22
(58) Field of Search ............. 250/492.22, 492.21, 250/310, 311, 396 R

(56) References Cited

U.S. PATENT DOCUMENTS

| | | | |
|---|---|---|---|
| 4,451,738 A | * 5/1984 | Smith | 250/491.1 |
| 4,694,178 A | * 9/1987 | Harte | 250/396 R |
| 4,980,567 A | 12/1990 | Yasuda et al. | 250/398 |
| 5,313,068 A | * 5/1994 | Meiri et al. | 250/398 |
| 5,614,725 A | * 3/1997 | Oae et al. | 250/492.2 |
| 5,736,281 A | * 4/1998 | Watson | 430/30 |
| 5,834,783 A | 11/1998 | Muraki et al. | 250/398 |
| 5,847,959 A | 12/1998 | Veneklasen et al. | 364/468.28 |
| 5,863,682 A | 1/1999 | Abe et al. | 430/30 |
| 5,905,267 A | 5/1999 | Muraki | 250/492.22 |
| 5,929,454 A | 7/1999 | Muraki et al. | 250/491.1 |
| 5,955,738 A | * 9/1999 | Manabe et al. | 250/492.22 |
| 5,973,332 A | 10/1999 | Muraki et al. | 250/492.2 |
| 5,981,954 A | 11/1999 | Muraki | 250/397 |
| 6,054,713 A | 4/2000 | Miyake et al. | 250/492.24 |
| 6,104,035 A | 8/2000 | Muraki | 250/492.22 |
| 6,107,636 A | 8/2000 | Muraki | 250/492.2 |
| 6,124,599 A | 9/2000 | Muraki | 250/492.22 |
| 6,137,113 A | 10/2000 | Muraki | 250/492.22 |
| 6,624,430 B2 | * 9/2003 | Higuchi | 250/492.23 |
| 6,674,086 B2 | * 1/2004 | Kamada et al. | 250/492.22 |

OTHER PUBLICATIONS

M. Parikh, "Corrections to Proximity Effects in Electron Beam Lithography", *J. Appl. Phys.*, 50(6), Jun. 1979, p. 4371 through p. 4377.

J.M. Pavkovich, "Proximity Effect Correction Calculations by the Integral Equation Approximate Solution Method", *J. Vac. Sci. Technol.*, B4(1), Jan./Feb. 1986, p. 159 through p. 163.

* cited by examiner

*Primary Examiner*—John R. Lee
*Assistant Examiner*—Kalimah Fernandez
(74) *Attorney, Agent, or Firm*—Fitzpatrick, Cella, Harper & Scinto

(57) ABSTRACT

A charged particle beam exposure system which draws a pattern on an object to be exposed by a plurality of charged particle beams emitted from a plurality of element electron optical systems includes (a) a storage device storing (i) a standard dose data for controlling the irradiation of charged particle beams to an object to be exposed, (ii) plural pieces of proximity effect correction data for correcting the irradiation of the charged particle beams for each incidence position with respect to the object to be exposed, in order to reduce the influence of a proximity effect, and (iii) calibration data for correcting variations in the irradiation dose among the plurality of the charged particle beams emitted from the plurality of element electron optical systems, and (b) a controller for controlling the irradiation of each of the charged particle beams, based on the standard dose data, the proximity effect correction data, and the calibration data.

15 Claims, 16 Drawing Sheets

FIG. 3A
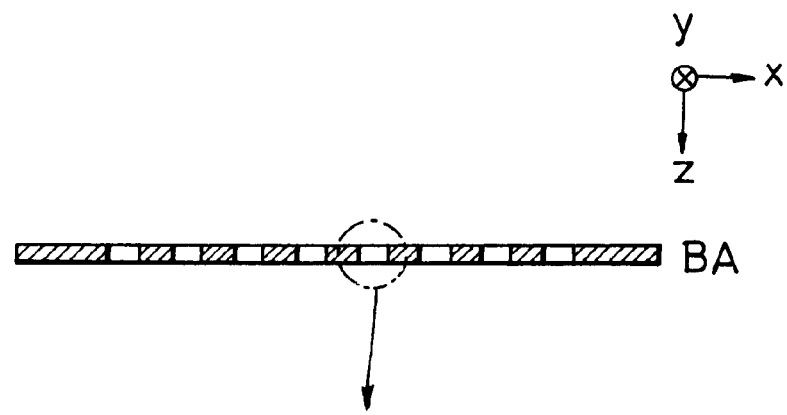
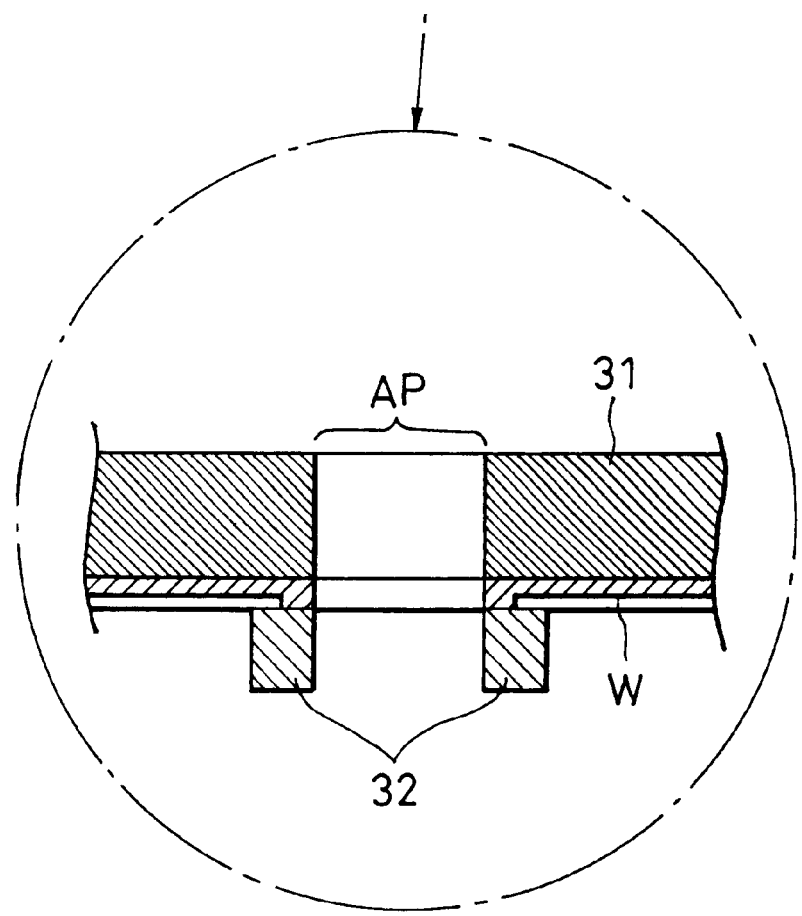
FIG. 3B

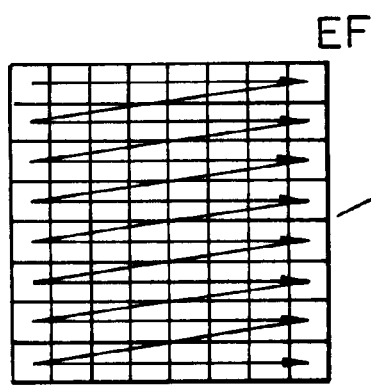
FIG. 8A
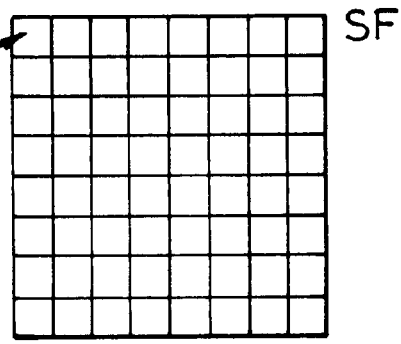
FIG. 8B
FIG. 8C
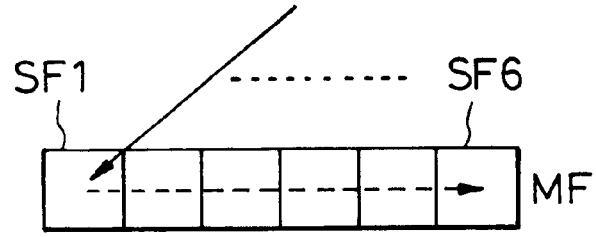
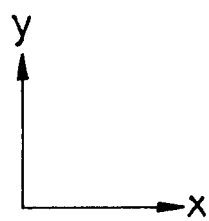
FIG. 8D
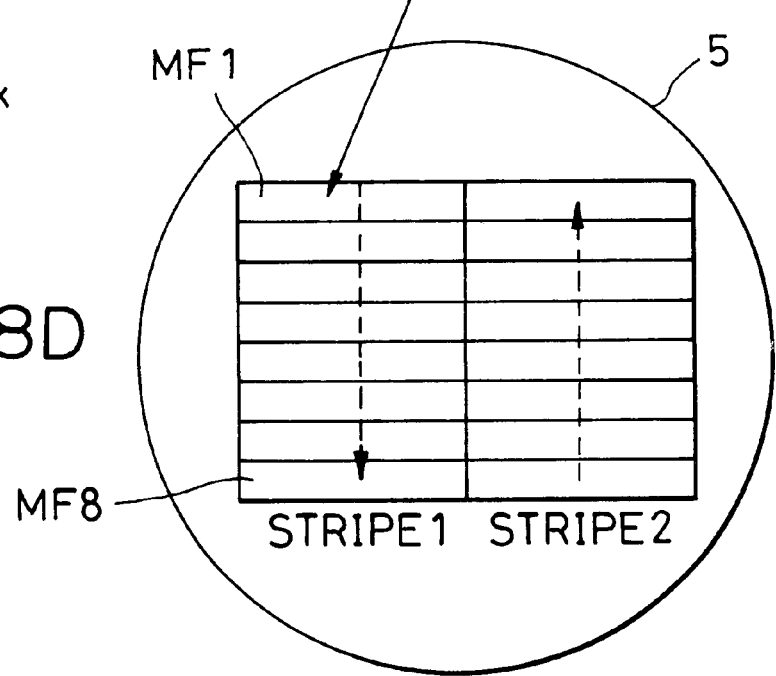

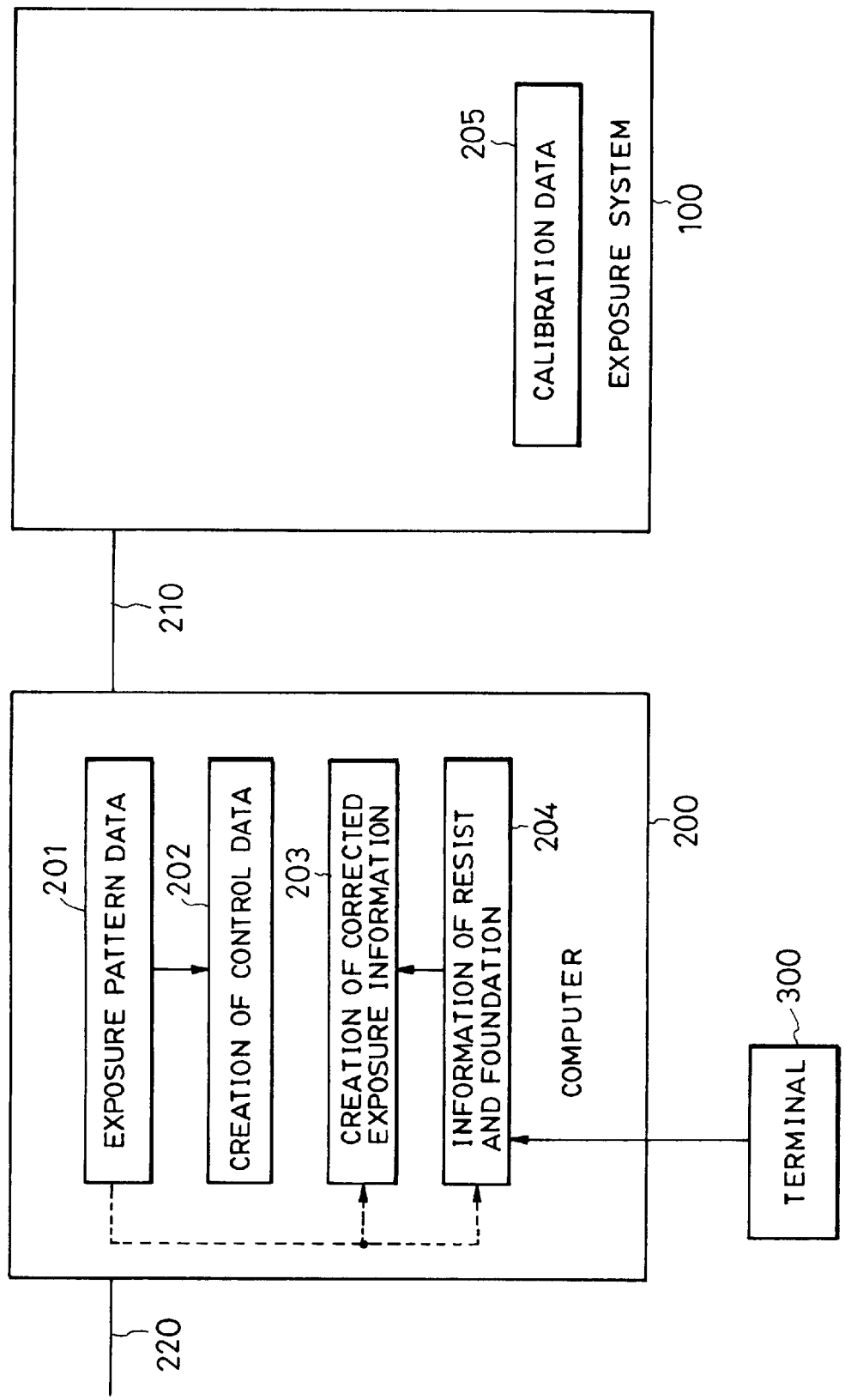

CORRECTING METHOD FOR CORRECTING EXPOSURE DATA USED FOR A CHARGED PARTICLE BEAM EXPOSURE SYSTEM

BACKGROUND OF THE INVENTION

1. Field of the Invention

The present invention relates to a multi-type charged particle beam exposure system which draws a pattern by a plurality of charged particle beams, an exposing method therefor, and a manufacturing method for manufacturing a device utilizing the exposing method. More particularly, the present invention relates to a charged particle beam exposure system, an exposing method therefor, and a manufacturing method for manufacturing a device utilizing the exposing method, the method permitting a proximity effect correction to be performed rapidly and appropriately, and permitting a correction, for eliminating variations among charged particle beams irradiated, to be performed at a predetermined timing, when drawing a pattern on a substrate by charged particle beams.

2. Description of the Related Art

In recent years, as means for drawing a micro-pattern on a specimen such as a semiconductor wafer or a mask substrate, an electron beam lithography system is used. In this system, however, the influence of a so-called proximity effect that causes the widening or narrowing of a pattern by backward-scattered electrons constitutes a problem.

One effective method for correcting the proximity effect is a correcting method for correcting an irradiation dose. As a method for determining the optimum irradiation dose, (a) a method using matrices (M. Parikhh, J. App. Phys. 19, p. 4371, p. 4378, p. 4383 (1979), (b) a method which uses a simple approximate solution as a formula (e.g., J. M. Parkovich, Journal of Vacuum Science & Technology B4, p. 159 (1986), or the like has been used.

The method (a) is a method wherein the relationship between the irradiation dose and the photosensitivity at each position is represented by a matrix, and the optimum irradiation dose at each position is found by obtaining the inverse matrix of the above-mentioned matrix. The advantage of this method is that the accurate optimum irradiation dose can be found if the size of a pattern, based on which the irradiation dose is set, is sufficiently reduced. On the other hand, the drawback thereof is that an enormous amount of calculation time is required. For example, in order to perform a correction with respect to all LSI chips being used directly for the drawing, it takes hundreds to thousands of hours.

The method (b) is a method wherein an approximate value D' is calculated using the following formulae (1) and (2)

$$D' = C/(1/2 + \eta U) \quad (1)$$

$$U = (1/\pi) \int \exp\{-(x-x')2 - (y-y')2\} dx'dy' \quad (2)$$

Here, C is a constant, $\pi$ is the photosensitivity ratio of a resist of forward scattering of an electron beam and that by backward scattering. With regard to the integration range of the parameter U, the evaluation points of the irradiation dose are set to be (x, y), and the integration is performed for rectangles existing within a circle which has a center (x, y), and which has a radius two to three times larger than the backward-scattering radius, or for rectangles, some of which exist within the circle. However, even though such an approximate solution is used, it takes several hours to perform a correction with respect to all LSI chips being used directly for the drawing.

Furthermore, in a multi-type charged particle beam exposure system, which draws a pattern by a plurality of charged particle beams, it is difficult to uniformly maintain the irradiation dose of all of the charged particle beams, because of influences of heat generated by charged particle beams irradiating a substrate.

As described above, the calculation time for correcting a proximity effect requires at least several hours. On the other hand, $\pi$, a parameter for the calculation for the proximity effect correction, a backward-scattering radius, and the like, are varied depending on a resist applied to a wafer or a film material on the surface of a wafer. It is, therefore, necessary to determine the parameter (such as $\pi$ and the backward-scattering radius) for achieving the optimum proximity effect. For this purpose, the step of recalculating the correction of a proximity effect by changing the parameter, and the step of actually exposing the wafer using the recalculated proximity effect correction and then evaluating the result obtained, are performed repeatedly. This means that the electron beam lithography system is exclusively employed for tens of hours to determine the parameter. This results in a reduction in the availability of the system.

Moreover, in a multi-type charged particle beam exposure system which draws a pattern by a plurality of charged particle beams, in order to achieve an exposure with a uniform irradiation dose by eliminating variations in the irradiation dose among a plurality of charged particle beams, for example, a calibration (correction) for changing duties among the beams is indispensable.

SUMMARY OF THE INVENTION

Accordingly, it is an object of the present invention to solve the above-described problems associated with the conventional art.

In accordance with a first aspect, the present invention provides a charged particle beam exposure system which draws a pattern on an object to be exposed by a plurality of charged particle beams. This system comprises (a) a storage device storing (i) standard dose data for controlling the irradiation of charged particle beams to an object to be exposed, (ii) plural pieces of proximity effect correction data for correcting the irradiation of the charged particle beams for each incidence position with respect to the object to be exposed, in order to reduce the influence of a proximity effect, and (iii) calibration data for correcting variations in the irradiation dose among a plurality of the charged particle beams; and (b) a controller for controlling the irradiation of each of the charged particle beams, based on the standard dose data, the proximity effect correction data, and the calibration data.

The standard dose data preferably include bit map data which are determined depending on the pattern to be exposed.

Also, the standard dose data may include the data defining the bit map data and a ratio of the irradiation time with respect to the non-irradiation time.

Preferably, the present invention, in this aspect, includes means for obtaining the calibration data by measuring variations in the irradiation dose among a plurality of the charged particle beams. The above-mentioned obtaining means may include a Faraday cup.

The present invention, in this aspect, preferably includes means for selecting one piece of data suitable for the proximity effect correction with respect to the standard dose data, from plural pieces of the proximity effect correction data stored in the memory device.

In accordance with a second aspect, the present invention provides a method for correcting exposure data for drawing a pattern on an object to be exposed by a plurality of charged particle beams, comprising the step of creating standard dose data for each irradiation position of the charged particle beams in order to expose a standard pattern on the object to be exposed; the step of creating or renewing a plurality of proximity effect correction data for each irradiation position depending on conditions of the object to be exposed; the step of selecting any one piece of the proximity effect correction data, from plural pieces of the proximity effect correction data for each irradiation position; the step of performing a proximity effect correction with respect to the standard dose data based on the selected data, and exposing apattern on the object to be exposed; the step of evaluating the exposed pattern, and judging whether the selected one piece of proximity effect correction data is the optimum data for controlling the standard dose data; the step of determining the optimum proximity effect correction data for controlling the standard dose data in accordance with the judgment; the step of measuring, by a sensor, the irradiation dose of the charged particle beams from each element electron optical system, the irradiation dose having been subjected to a correction by the proximity effect correction data; and the step of determining the calibration data of each of the element electron optical systems, based on the irradiation dose measured by the above-mentioned measuring.

Whether the selected one piece of proximity effect correction data is the optimum data for controlling the standard dose data is preferably judged by comparing the exposed pattern and the standard pattern by a visual inspection.

Also, whether the selected one piece of proximity effect correction data is the optimum data for controlling the standard dose data is preferably judged by evaluating means for comparing the exposed pattern and the standard pattern.

Preferably, the proximity effect correction data is data not depending on the pattern to be exposed, but data depending on the conditions of the object to be exposed.

The conditions are preferably determined as at least one parameter among the fundamental conditions of the object to be exposed, the resist material, and a backward-scattering radius.

The above-mentioned sensor used in the measuring step may include a Faraday cup.

The present invention, in a third aspect, provides a method for manufacturing a device, comprising the step of providing an exposure system as discussed above; the step of exposing a pattern on a wafer using the exposure system; and the step of assembling the device by processing the wafer on which the pattern has been exposed.

Further objects, features and advantages of the present invention will become apparent from the following description of the preferred embodiments with reference to the attached drawings.

BRIEF DESCRIPTION OF THE DRAWINGS

FIGS. 3A and 3B are diagrams showing one deflector drawn from deflectors formed in a blanker array (BA);

FIGS. 8A to 8D are diagrams for explaining the principles of exposure by the electron beam exposure system shown in FIG. 1;

FIG. 9 is a block diagram showing the construction of the system including an exposure system;

DESCRIPTION OF THE PREFERRED EMBODIMENTS

As one example of a charged particle beam exposure system, a multi-type electron beam exposure system which draws a pattern by using a plurality of charged particle beams will be described below. The present invention can be applied not only to an electron beam exposure system, but also, for example, to an ion beam exposure system.

Figure 1:
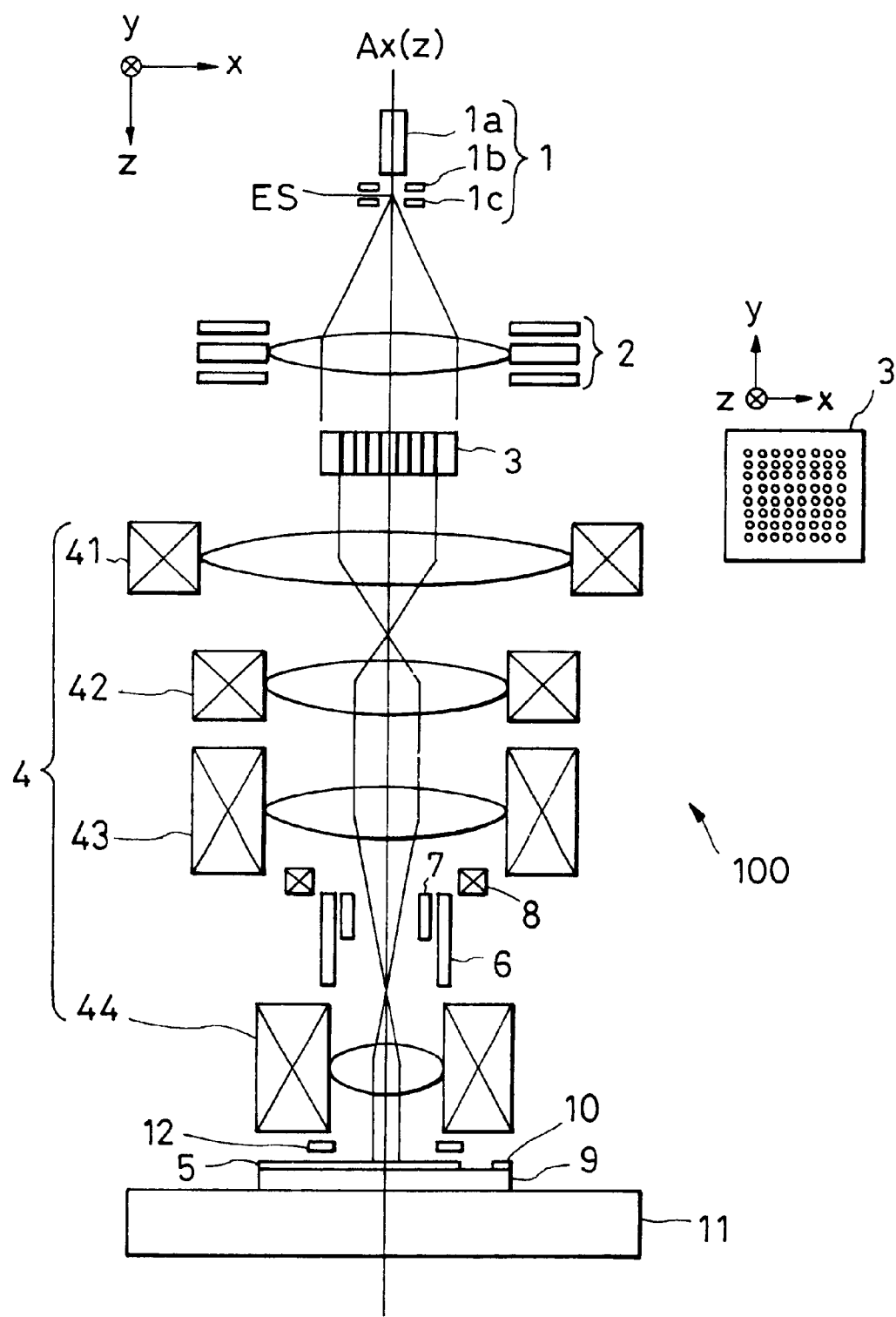
FIG. 1 is a schematic diagram showing an electron beam exposure system in accordance with a preferred embodiment of the present invention.

FIG. 1 shows an electron beam exposure system in accordance with a preferred embodiment of the present invention. In FIG. 1, reference numeral 1 denotes an electron gun comprising a cathode 1$a$, a grid 1$b$, and an anode 1$c$. The electrons emitted from the cathode 1$a$ form a crossover image as an electron source ES between the grid 1$b$ and the anode 1$c$.

Electron beams emitted from the electron source ES irradiate a correction electron optical system 3 via condenser lens 2. The condenser lens 2 is constructed of, for example, three opening electrodes.

Figure 2A:
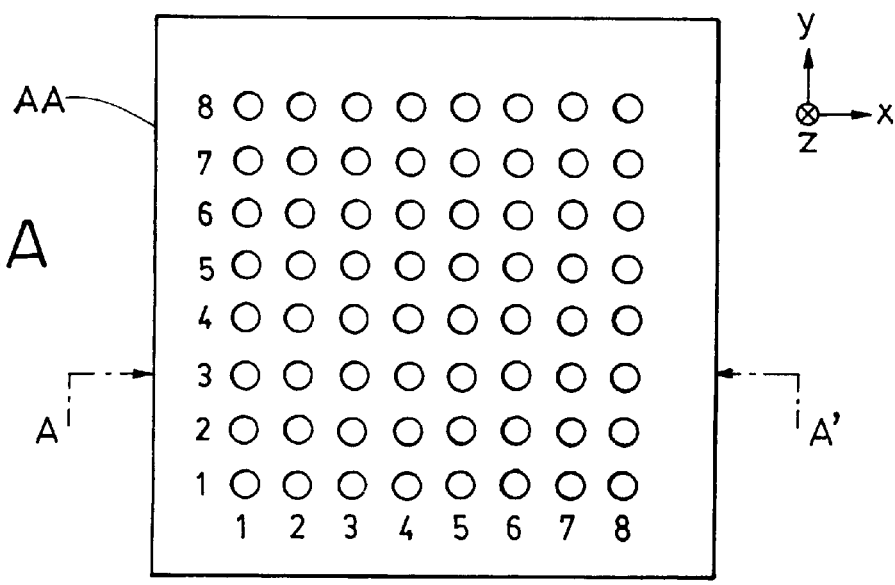
FIGS. 2A and 2B are diagrams showing the particular construction of a correction electron optical system.
Figure 2B:
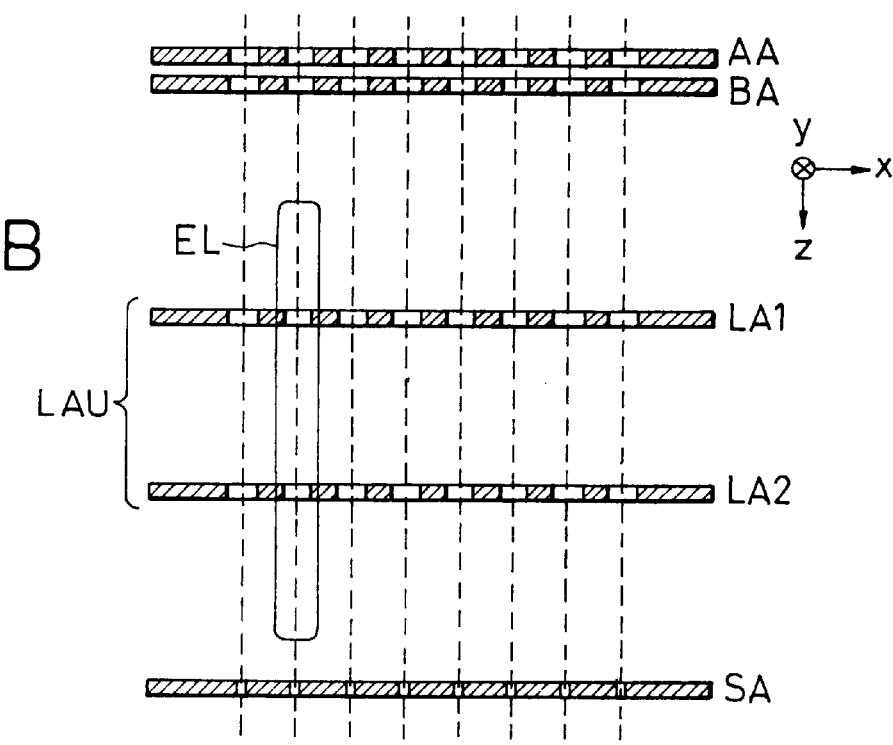

As shown in FIG. 2B, the correction electron optical system 3 is constructed of an aperture array AA, a blanker array BA, correction electron optical system units LAU, and a stopper array SA which are disposed in sequence along the optical axis AX from the electron gun 1 side. Hereafter, the correction electron optical system 3 will be described in detail.

Returning to FIG. 1, the correction electron optical system 3 forms a plurality of intermediate images, and each of the intermediate images is reducedly projected onto the substrate 5 of a wafer or the like by a demagnification electron optical system 4 which is described hereafter. Thereby, a plurality of electron source images having the same shape is formed on the substrate 5. The correction electron optical system 3 forms the above-mentioned intermediate images so as to correct aberration occurring when a plurality of the intermediate images is reducedly projected onto the substrate 5 via the electron optical system 4.

The demagnification electron optical system 4 is constructed of a symmetrical magnetic doublet constituted by a first projection lens 41 and a second projection lens 42, and a symmetrical magnetic doublet constituted by a first projection lens 43 and a second projection lens 44. Letting the focal length of the first projection lens 41 (43) be f1, and that of the second projection lens 42 (44) be f2, the distance between the two projection lenses is f1+f2.

The object point on the optical axis AX is situated at the focal position of the first projection lens 41 (43), and the image point thereof is formed at the focus of the second projection lens 42 (44). This image is reduced into −f2/f1. The exposure system 100 is determined so that two lens magnetic fields act in the reverse directions to each other. Therefore, in theory, Seidel aberration, and chromatic aberration with respect to rotation and magnification are cancelled, apart from five others aberrations: spherical aberration, isotropic astigmatism, isotropic coma aberration, image surface curve aberration, and axial chromatic aberration.

Reference numeral 6 denotes a deflector deflecting a plurality of electron beams from the correction electron optical system 3, and deflecting a plurality of the electron images on the substrate 5 in X and Y directions by substantially the same amount of displacement. Although it is not shown in the figure, the deflector 6 is constructed of a main deflector used when the deflection width is large, and an auxiliary deflector used when the deflection width is small. The main deflector is an electromagnetic type deflector, and the auxiliary deflector is an electrostatic type deflector.

Reference numeral 7 denotes a dynamic focus coil which corrects the displacement of the focal position of the electron source due to deflection aberration occurring when the deflector 6 is actuated. Reference numeral 8 denotes a dynamic astigmatism correction coil which corrects the astigmatism of the deflection aberration generated by the deflection.

Reference numeral 9 denotes a θ-Z stage which places the substrate 5 thereon, and which can be moved in the optical axis AX (Z axis) direction and in the rotational direction about the Z axis, and a sensor 10 fixed to the stage 9 includes, for example, a Faraday cup. The sensor 10 individually detects the irradiation dose of each of the charged particle beams incident on the stage 9.

Reference numeral 11 denotes an X-Y stage, which mounts the θ-Z stage, and which can be moved in the X-Y directions orthogonal to the optical axis AX (Z axis).

Next, the construction of the correction electron optical system 3 will be described with reference to FIGS. 2A and 2B. As described above, the correction electron optical system 3 is constructed of the aperture array AA, the blanker array BA, the correction electron optical system units LAU, and the stopper array SA.

FIG. 2A is a diagram showing the correction electron optical system 3, as viewed from the electron gun 1 side, and FIG. 2B is a cross-sectional view taken along the line A–A′ of FIG. 2A.

As shown in FIG. 2A, the aperture array AA has a structure in which a plurality of apertures are provided in the substrate, and divides an electron beam from the condenser lens 2 into a plurality of electron beams. The blanker array BA is constructed by forming a plurality of deflectors on one substrate, the deflectors each individually deflecting each of the electron beams formed in the aperture array.

Figure 4:
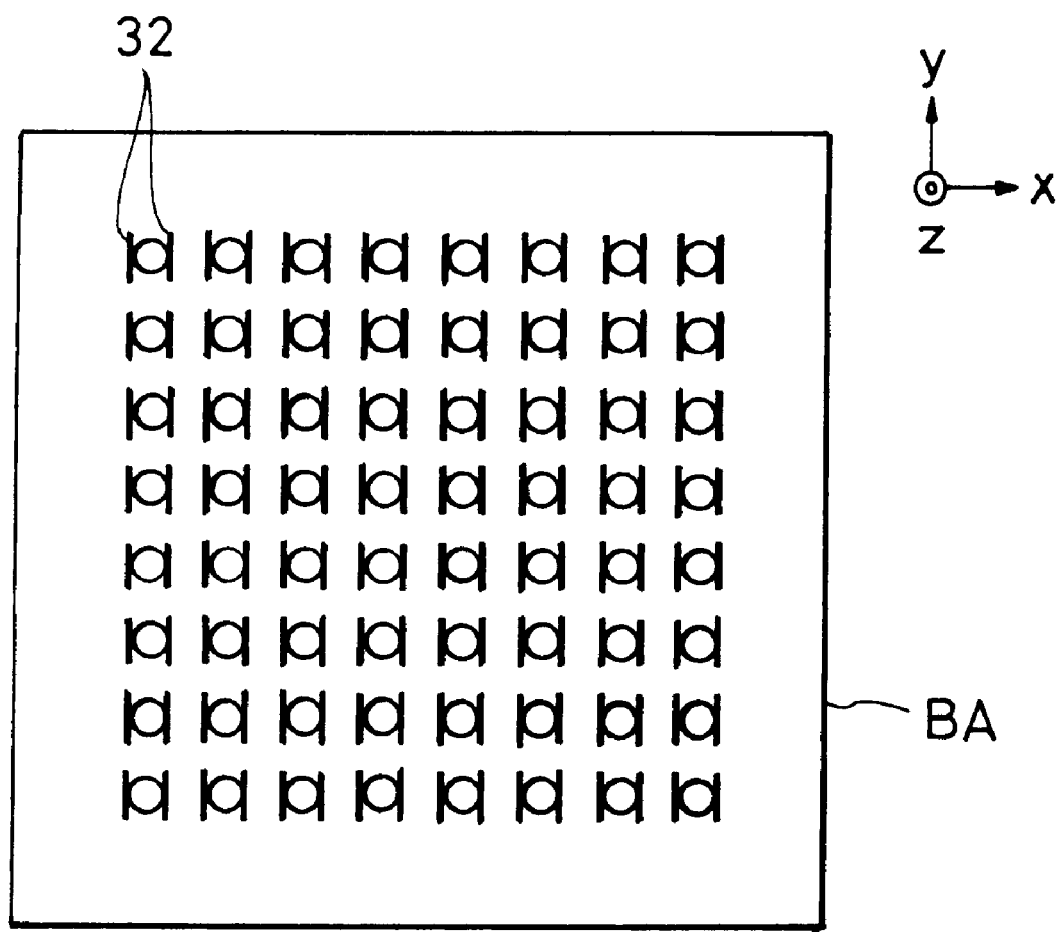
FIG. 4 is a diagram showing a blanker array, as viewed downward.

FIGS. 3A and 3B are diagrams showing one deflector drawn from a plurality of the deflectors formed in a blanker array BA. FIG. 4 is a diagram showing a blanker array BA, as viewed downward. As shown in FIGS. 3A and 3B, the blanker array BA is constructed of the substrate 31 having a plurality of apertures AP formed therein and a pair of electrodes across each of the apertures. The blanker array BA has blankers 32 each having a deflecting function, and wiring for individually turning the blankers 32 on/off.

The correction electron optical system LAU is constructed of a first electron optical system array LA1 which is an electron lens array formed by two-dimensionally arranging a plurality of electron lenses on the identical plane, and a second electron optical system LA2.

Figure 5:
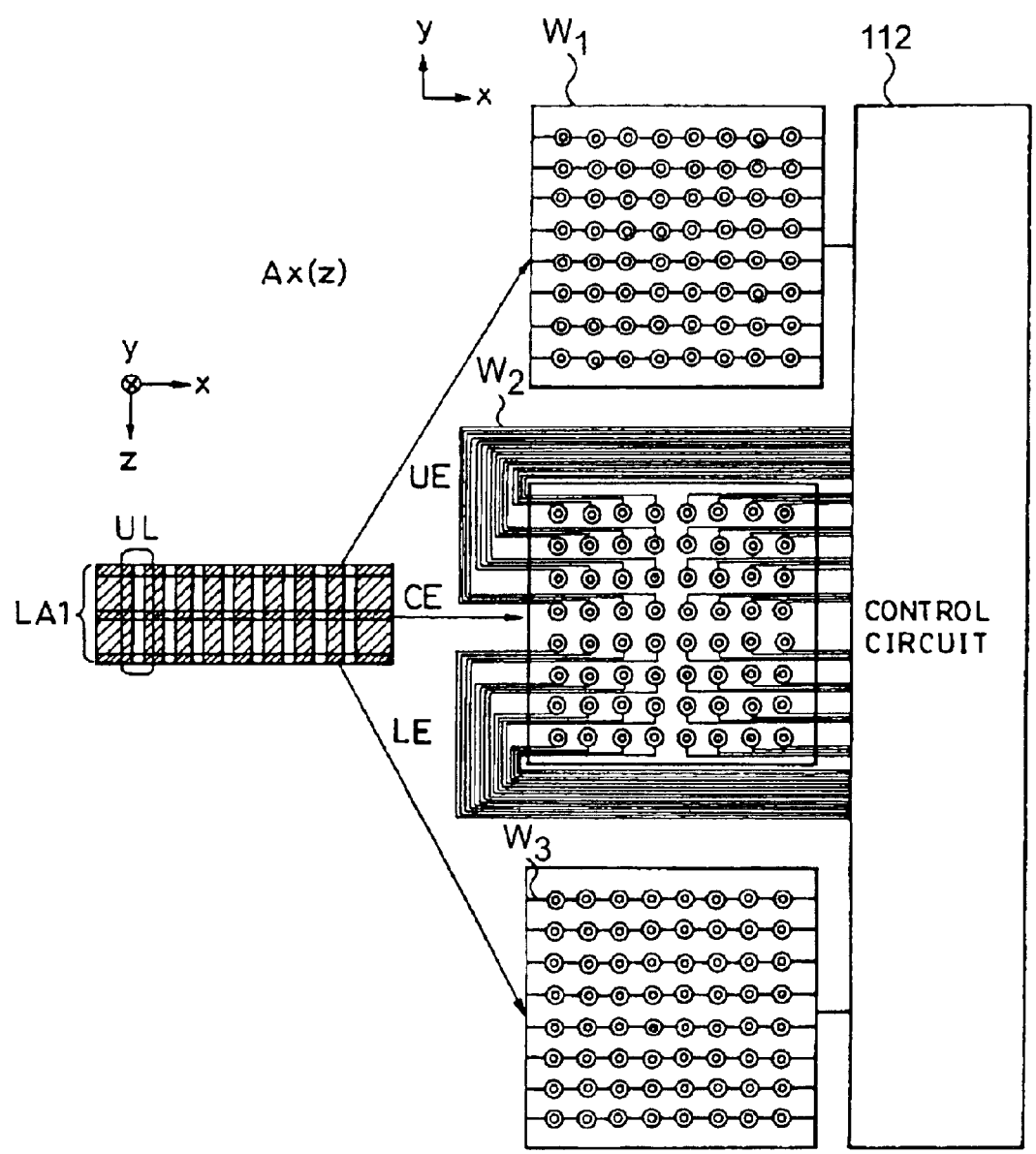
FIG. 5 is a diagram for explaining first and second electron optical system arrays.

FIG. 5 shows the first electron optical system array LA1. Each of the first electron optical system arrays LA1 has an upper electrode plate UE, an intermediate electrode plate CE, and a lower electrode plate LE, in each of which a plurality of doughnut-shaped electrodes corresponding to a plurality of apertures is arranged. Each of the first electron optical system arrays LA1 is constructed by laying up these three electrode plates through the intermediary of insulating materials.

The upper, intermediate, and lower doughnut-shaped electrode plates, which have equal X-Y coordinates, constitute one electron lens (a so-called unipotential lens) UL. The upper doughnut-shaped electrode plate of each of the electron lenses UL is connected to the LAU control circuit 112 by the common wiring W1, and the lower doughnut-shaped electrode plate of each of the electron lenses UL is connected to the LAU control circuit 112 by the common wiring W3. An acceleration potential of electron beams is applied across the upper doughnut-shaped electrode plate and the lower doughnut-shaped electrode plate. An appropriate potential is supplied from the LAU control circuit 112 to the intermediate doughnut-shaped electrode plate of each of the electron lenses via individual wiring W2. Thereby, it is possible to set the electron optical power (focal length) of each of the electron lenses to a desired value. The second electron optical system array LA2 has the same structure and functions as those of the first electron optical system array LA1.

As shown in FIG. 2B, in the correction electron optical system unit LAU, the electron lenses of the first electron lens array LA1 and those of the second lens array LA2, each of which has an equal X-Y coordinate, constitute an element electron optical system EL.

The aperture array AA is situated at substantially the front side focal position of each of the element electron optical systems EL. Each of the element electron optical systems EL, therefore, forms an intermediate image of the electron source ES by each of the divided electron beams, at substantially the rear side focal position. Here, in order to correct the image surface curve aberration occurring when the intermediate images are reducedly projected upon the substrate 5 via the demagnification electron optical system 4, the electron optical power of the electron lens is adjusted by adjusting the potential applied to the intermediate doughnut-shaped electrode for each element electron optical system EL, whereby the formation position of the intermediate images is adjusted.

The stopper array SA has a structure wherein a plurality of apertures is formed in the substrate, as in the case of the aperture array AA. The electron beam deflected by the blanker array BA is irradiated out of the aperture of the stopper array SA corresponding to the electron beam, and is blocked by the substrate.

Figure 6:
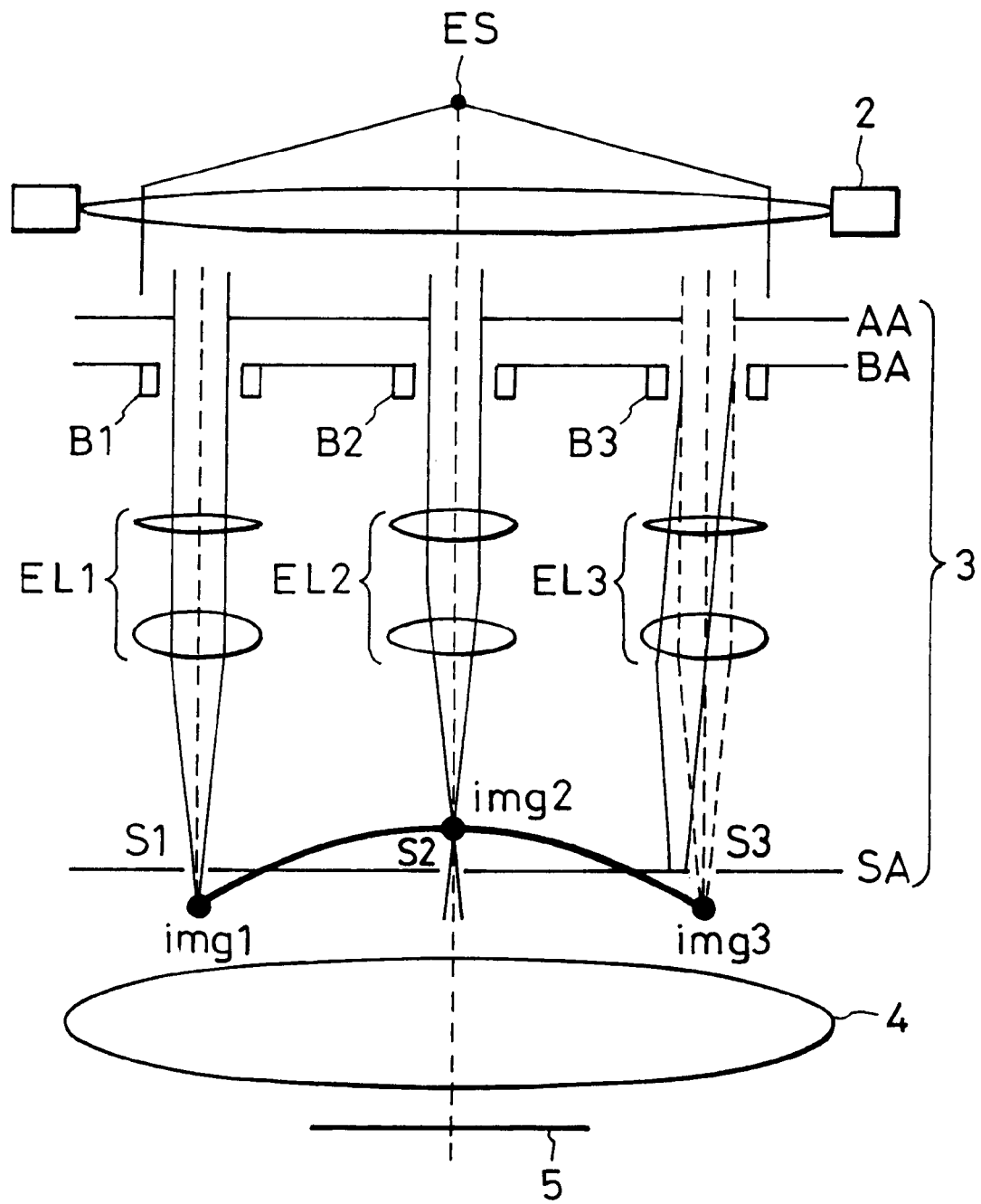
FIG. 6 is a diagram for explaining the functions of a correction electron optical system.

Next, the function of the correction electron optical system 3 will be described using FIG. 6. The electrons emitted from the electron source ES pass through the condenser lens 2, and thereby, electron beams substantially parallel to each other are formed. These substantially parallel electron beams are divided into a plurality of electron beams by the aperture array AA having a plurality of the apertures. Each of the divided electron beams is made incident on the element electron optical systems EL1 through EL3, and forms intermediate images img1 through img3 of the electron source ES at substantially the front side focal position of each of the element electron optical systems. Each of the intermediate images is projected upon the substrate 5 as an object to be exposed via the demagnification electron optical system 4.

Here, in order to correct the image surface curve aberration (the deviation of the actual image-forming position from the ideal image-forming position on the substrate 5 in the direction of the optical axis of the demagnification system) occurring when a plurality of the intermediate images is reducedly projected upon the object to be exposed, the optical properties of a plurality of the element electron optical systems are individually set, and the formation positions of the intermediate images in the direction of the optical axis are made different for each element electron optical system, as described above.

The blankers B1 through B3 of the blanker array BA and the stoppers S1 through S3 of the stopper array SA individually control whether each electron beam is to be emitted onto the substrate 5. In FIG. 6, since the blanker B3 has been turned on, the electron beam which would otherwise form the intermediate image img3 does not pass through the aperture S3 of the stopper array SA, and is blocked by the substrate of the stopper array SA.

Figure 7:
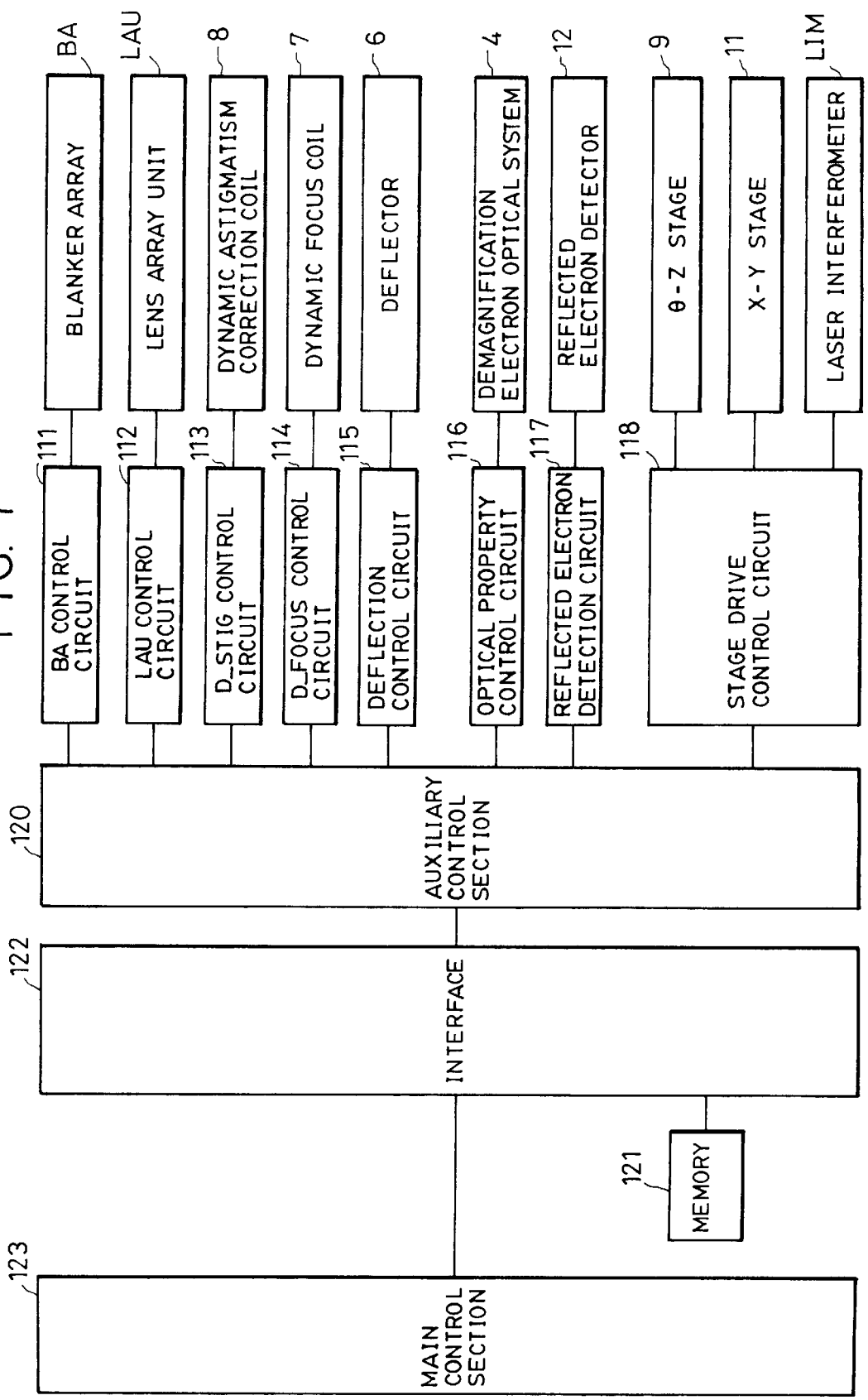
FIG. 7 is a block diagram showing the construction of the control system of the electron beam exposure system shown in FIG. 1.

FIG. 7 shows the construction of the control system of the electron beam exposure system 100 shown in FIG. 1. BA control circuit 111 is a control circuit for individually controlling turning on/off of each blanker of the blanker array BA. The construction and function thereof will be described in detail hereafter. Here, LAU control circuit 112 is a control circuit for controlling the focal length of the electron lens EL constituting the lens array unit LAU, $D_{13}$ STIG control circuit 113 is a circuit for controlling the dynamic astigmatism correction coil 8 to correct the astigmatism of the demagnification electron optical system 4, and D_FOCUS control circuit 114 is a circuit for controlling the dynamic focus coil 7 to adjust the focus of the demagnification electron optical system 4. A deflection control circuit 115 is a control circuit for controlling the deflector 6, and an optical property control circuit 116 is a circuit for adjusting the optical properties (magnification and distortion) of the demagnification electron optical system 4. A reflected electron detection circuit 117 is a circuit for computing the amount of reflected electrons from the signals from a reflected electron detector 12.

A stage drive control circuit 118 is a control circuit which drivingly controls the θ-Z stage 9 and also drivingly controls the X-Y stage 11 in cooperation with a laser interferometer LIM for detecting the position of the X-Y stage 11.

An auxiliary controller 120 reads out exposure control data stored in a memory or other storage device 121 via an interface 122, and thereby controls control circuits (control elements) 111 through 116 and 118, and controls a reflected electron detection circuit 117. A main controller 123 exercises control over the entire electron beam exposure system 100.

Next, the schematic operation of the electron beam exposure system 100 shown in FIG. 1 will be described with reference to FIG. 7.

Figure 10:
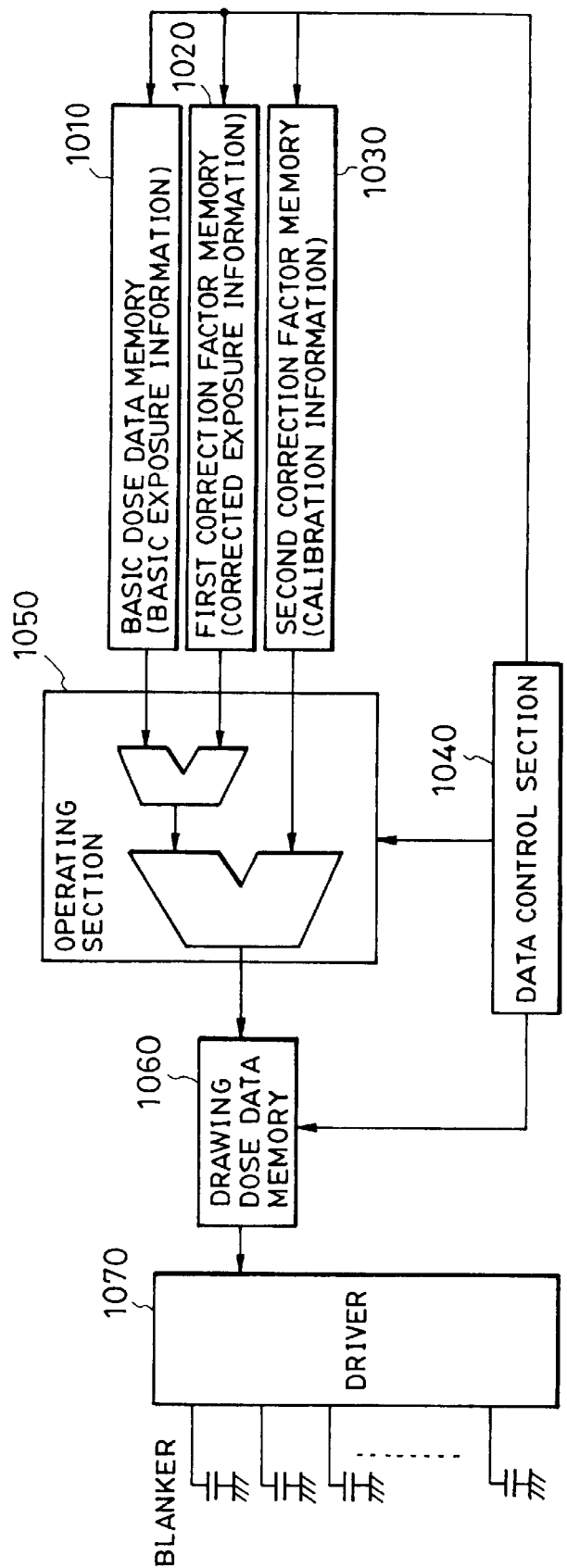
FIG. 10 is a block diagram for explaining the construction of a blanker array (BA) control circuit.

Auxiliary controller 120 reads out the exposure control data from the memory 121, extracts deflection control data (e.g., the main deflector standard position, the auxiliary deflector standard position, main deflection stage follow-up data, deflection control data) as control data for controlling the deflector 6 from the above-mentioned exposure control data, and provides these deflection control data to the deflection control circuit 115. At the same time, the auxiliary controller 120 extracts blanker data and data for correcting the control over the blankers as control data for controlling each blanker of blanker array BA from the above-mentioned exposure control data, and provides these data to the BA control circuit 111. As shown in FIG. 10, the data provided here are stored in a basic dose data memory 1010 and a first correction factor memory 1020 of the BA control circuit 111.

A deflection control circuit 115 controls the deflector 6 based on the deflection control data, and thereby deflects a plurality of the electron beams. At the same time, the BA control circuit 111 controls each blanker of the blanker array BA, and thereby turns each blanker on/off depending on the pattern to be drawn. When scanning the substrate 5 by a plurality of the electron beams in order to draw a pattern on the substrate 5, the X-Y stage 11 is continuously moved in the Y direction, and a plurality of the electron beams is deflected by the deflector 6 so as to follow the movement of the X-Y stage.

As shown in FIGS. 8A to 8D, each of the electron beams performs scan exposure with respect to a corresponding element exposure field (EF) on the substrate 5. This electron beam exposure system is designed so that an element exposure field (EF) by each of the electron beams is two-dimensionally contiguous to each other, and hence, a subfield (SF) constructed of a plurality of element exposure fields (EF) is exposed at once. In the example shown in FIGS. 8A to 8D, one element exposure field (EF) is constituted by a matrix having 8×8 elements. Each element of this matrix indicates the field (position) which the electron beam deflected by the deflector 6 irradiates on the substrate 5. More specifically, one element exposure field (EF) constituted of the matrix having 8×8 elements is scanned in the order indicated by the arrow in FIGS. 8A to 8D.

After one subfield (SF1) has been exposed, the auxiliary controller 120 instructs the deflection control circuit 115 to deflect, by the deflector 6, a plurality of electron beams in the direction (x direction) orthogonal to the scanning direction (y direction) of the X-Y stage 11 during scan exposure, so that the next subfield is exposed.

With such a change of a subfield, aberrations, when each electron beam is reducedly projected via the demagnification electron optical system, are also changed. Accordingly, the auxiliary controller 120 instructs the LAU control circuit 112, D_STIG control circuit 113, and D_FOCUS control circuit 114 to adjust the lens array unit LAU, the dynamic astigmatism correction coil 8, and the dynamic focus coil 7, so as to correct for the changed aberration.

After the subfield has been changed, a second subfield (SF2) is exposed by again performing the exposure with respect to the corresponding element exposure field (EF) by a plurality of the electron beams. In this manner, as shown in FIGS. 8A to 8D, by performing the exposure of the subfields SF1 through SF6 in sequence, the exposure of a main field (MF) constituted of subfield 1 through subfield 6 arranged in the direction (x direction) orthogonal to the scanning direction (y direction) of the X-Y stage 11 during the scan exposure, is completed.

After the exposure of the first main field (MF1) has been thus completed, the auxiliary controller 120 instructs the deflection control circuit 115 to deflect in sequence a plurality of the electron beams toward main fields (MF2, MF3, MF3, MF4) sequentially arranged in the scanning direction (y direction) of the X-Y stage 11, and performs the exposure thereof. Thereby, as shown in FIGS. 8A to 8D, the exposure of a stripe δ field (STRIPE 1) constituted of main fields (MF2, MF3, MF3, MF4) is performed. Then, the auxiliary controller 120 instructs the stage drive control circuit 118 to steppingly move the X-Y stage in the x direction, and performs the exposure of a next stripe δ field (STRIPE 2).

FIG. 9 shows the construction of a system including the exposure system. This system comprises the electron beam exposure system 100 shown in FIG. 1, and a computer 200 connected to the electron beam system 100 via a communication cable 210. The computer 200 acquires exposed pattern data from, for example, other computers via communication lines 220, creates exposure control data suitable for the electron beam exposure system 100, based on this exposed pattern data, and provides these data to the electron beam exposure system 100 via the communication cable 210.

More specifically, the computer 200 acquires exposed pattern data from other computers via communication cable 210, and stores them in a storage section 201. The exposed pattern data may be acquired from the memory medium (e.g., a magnetic tape, disk, or the like) in which the exposure pattern data is stored.

Next, the computer 200 creates a plurality of control data for controlling the electron beam exposure system 100 (e.g., dot control data or dose control data for controlling blankers, deflection control data for controlling the deflector, etc.) based on the exposed pattern data. The control data created here includes standard dose data as basic exposure information.

The "standard dose data" represents information constituting the basis of the drawing information depending on a pattern to be exposed, based on which the opening and closing of a blanker is controlled. Specifically, the standard dose data includes the construction of bit map data ("0" or "1"), or the data (duty) defining a bit map and the opening and closing times (i.e., the ratio of the irradiation time with respect to the non-irradiation time) of the blankers.

The irradiation light emitted by the electron gun 1a has a certain irradiation intensity, and is capable of controlling irradiation energy so as to be a desired value in accordance with the duty of the blanker. The term "proximity effect correction" hereafter referred to, is to perform a correction wherein the duty, which does not depend on the drawing pattern, but which is defined by the standard dose data in consideration of the conditions which an object to be exposed has, is increased or decreased by δ, and to thereby realize the optimum irradiation (exposure) state for the object to be exposed.

Next, the computer 200, in a correction exposure information generator 203, creates correction exposure information for performing a proximity effect correction for each irradiation position with respect to the standard dose data generated by a control data generator 202. The correction exposure information is correction data not depending on an exposed pattern, and is created in consideration of the backward-scattering radius when a pattern is exposed on a surface to be exposed, the difference in a resist material and foundation conditions, and the like, as parameters. The resist information and the foundation information 204, which are inputted from outside terminals and stored in the computer 200, may be referred to as the resist information and foundation information. Further, information on exposed patterns may also be considered. The standard dose data with respect to which a proximity effect correction has been performed is subjected to a correction of duty thereof.

In a calibration data generator 205 of the exposure system 100, mutual correction data (calibration data), among charged particle beams for correcting variations among irradiation beams generated under the influence of heating caused by the irradiation by the electron beams, are created.

In the exposure system 100, this calibration data is determined based on the results individually detected with respect to the irradiation dose for each incident electron beam by means of a sensor (including a Faraday cup) fixed on the stage 9 (FIG. 1) for mounting an object to be exposed, and these results are stored in the second correction factor memory 1030 shown in the BA control circuit section 111 in FIG. 10.

FIG. 10 shows an example of the BA control circuit (blanker array control circuit) 111 described with reference to FIG. 7. The blanker array control circuit 111 comprises a storage device, including a basic dose data memory 1010 which stores the standard dose data as basic exposure information; the first correction factor memory 1020 which stores correction exposure information including the proximity effect correction factor; the second correction factor memory 1030 which stores calibration information for performing a correction (calibration) with respect to variations among a plurality of irradiation beams. The blanker array control circuit 111 also comprises a data controller 1040 which controls the selecting of data for performing a proximity effect correction and a calibration among irradiation beams with respect to the standard dose data, in order to realize an appropriate exposure for an object to be exposed; a computing element 1050 for computing drawing dose data in order to draw a pattern on the object to be exposed based on data selected as the most appropriate correction exposure information and calibration information in accordance with the above-described result of the selection control; a drawing dose data memory 1060 for temporarily storing the output of the computing results; and a driver 1070 for driving blankers based on the drawing dose data.

Figure 11:
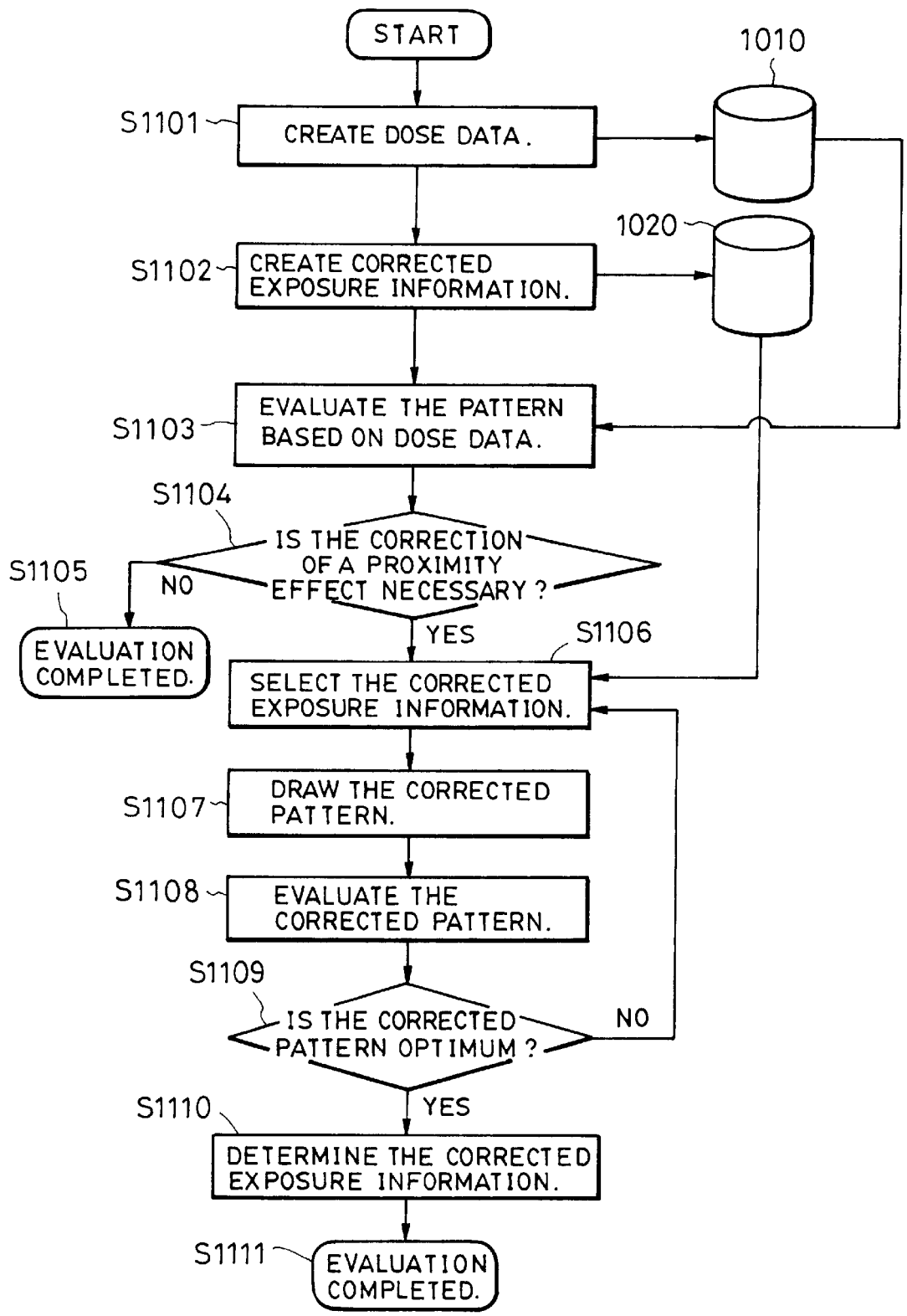
FIG. 11 is a flowchart for explaining the flow of the evaluation processing for establishing exposure correction information.

FIG. 11 shows a flowchart of the evaluation in relation to the creation of data and the selection and determination of the correction exposure information. In step S1101, the standard dose data are created, which include the base exposure information in the control data generator 202 in the computer 200, and are stored in the basic dose memory 1010 of the BA control circuit section 111.

In step 1102, correction exposure information, including a proximity effect correction factor, is created in the correction exposure information generator 203, and is stored in the proximity effect correction factor memory 1020.

In step 1103, a pattern is drawn based on the standard dose data created in step 1101.

In step 1104, whether a proximity effect correction is necessary is judged based on the pattern drawn. If a proximity effect correction has been judged to be unnecessary, the evaluation is completed (S1105). On the other hand, if the proximity effect correction is judged to be necessary, the processing proceeds to step S1106, one piece of correction exposure information is selected from the correction exposure information stored in the first correction factory memory 1020 (S1106), and a pattern is drawn based on the dose data considering the correction exposure information (S1107). This pattern is referred is referred to as a "corrected pattern".

In step S1108, the corrected pattern is evaluated, and in step S1109, whether the correction exposure information selected in step S1106 has been appropriate, and whether the corrected pattern is optimum, are judged. If the correction exposure information selected is judged not to be appropriate, the processing returns to step S1106, other correction exposure information is selected, and the same process as in steps S1107 and S1108 is repeated. If the corrected pattern is judged to be optimum in step S1109, the processing proceeds to step S1110, the correction exposure information is established (S110), and the evaluation is completed (S1111).

Here, during the processing shown in FIG. 11, it is preferable that the processing in relation to the judgement as to whether a correction is necessary, and the selection of the correction exposure information (S1104 and S1106) be performed; further, the evaluation of the corrected pattern, and the judgement as to whether the corrected pattern is optimum (S1108 and S1109), be judged by a visual inspection of an operator, and selected. These processings, however, may be executed using an evaluating device performing the processing corresponding to each of the steps (steps S1104 and S1106, and steps S1108 and S1109).

Next, a description will be given of the procedure of correcting (calibrating) variations among the charged particles outputted from each element electron optical system.

Figure 12:
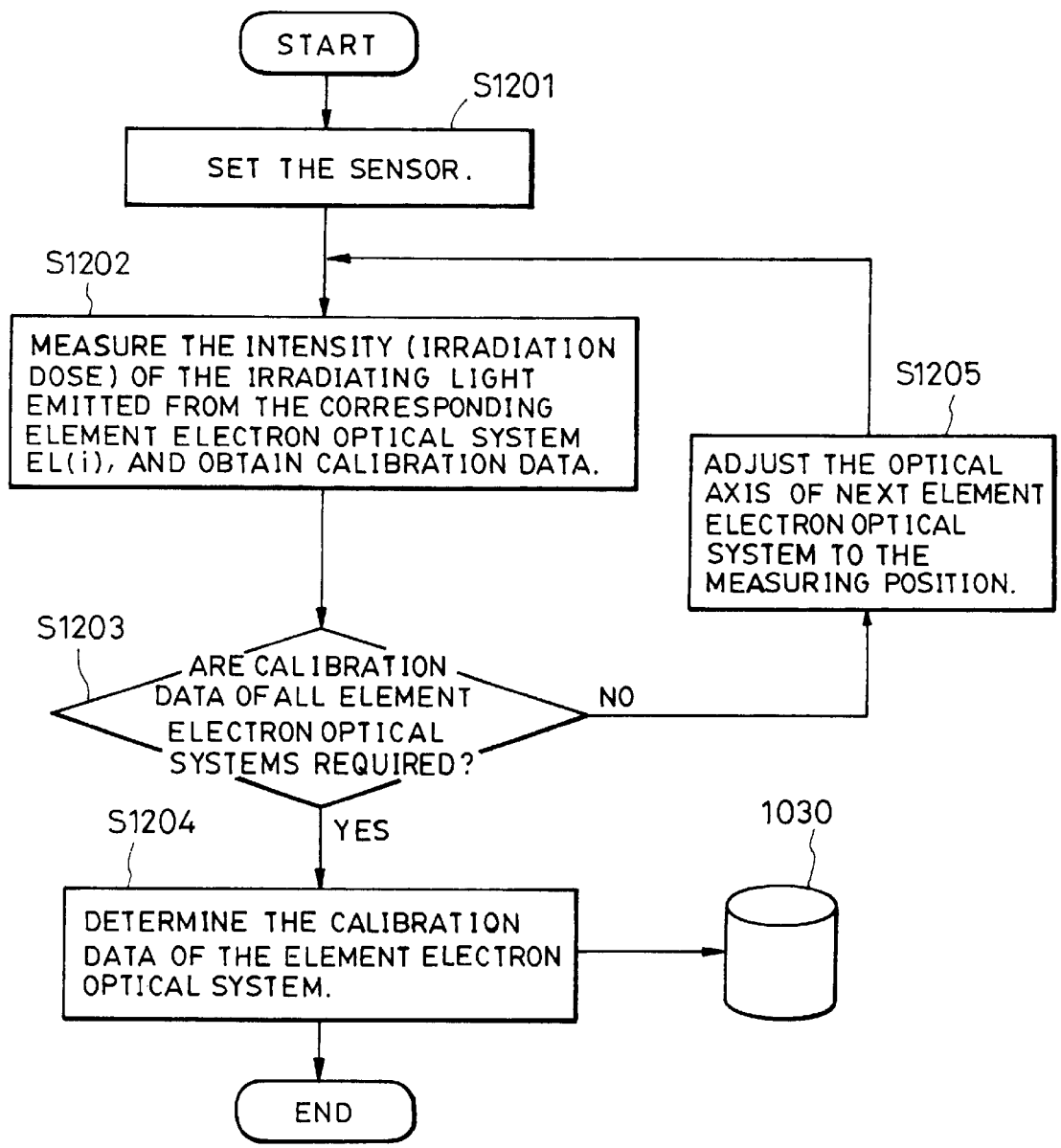
FIG. 12 is a flowchart for explaining the calibration procedure for calibration of an element electron beam optical system.

FIG. 12 shows the procedure for performing a calibration of an element electron beam optical system. First, in step S1201, the optical axis of the irradiation light of the element electron beam optical system EL(i) to be corrected, is adjusted to the measuring position. The measuring position is provided on the stage 9 (FIG. 1), and is a position where the intensity of an irradiation light beam can be measured by a sensor 10.

Then, the intensity (irradiation dose) of the irradiation light from the element electron optical system EL(i) is measured, calibration data is determined (S1202), and whether the calibration data of all element electron optical systems have been determined is judged (S1203). If all data has not been determined (S1203-No), the optical axis is adjusted to the image forming position of the irradiation light from the next element electron optical system (S1205), the intensity (irradiation dose) is measured in the same manner with respect to the irradiation light which has formed the image, and calibration data is determined (S1202).

If the calibration data of all of the element electron optical systems have been determined (S1203-Yes), the calibration data of the element electron optical systems is established (1204), and the results obtained are stored in the second correction factor memory 1030 shown in FIG. 10.

Figure 13:
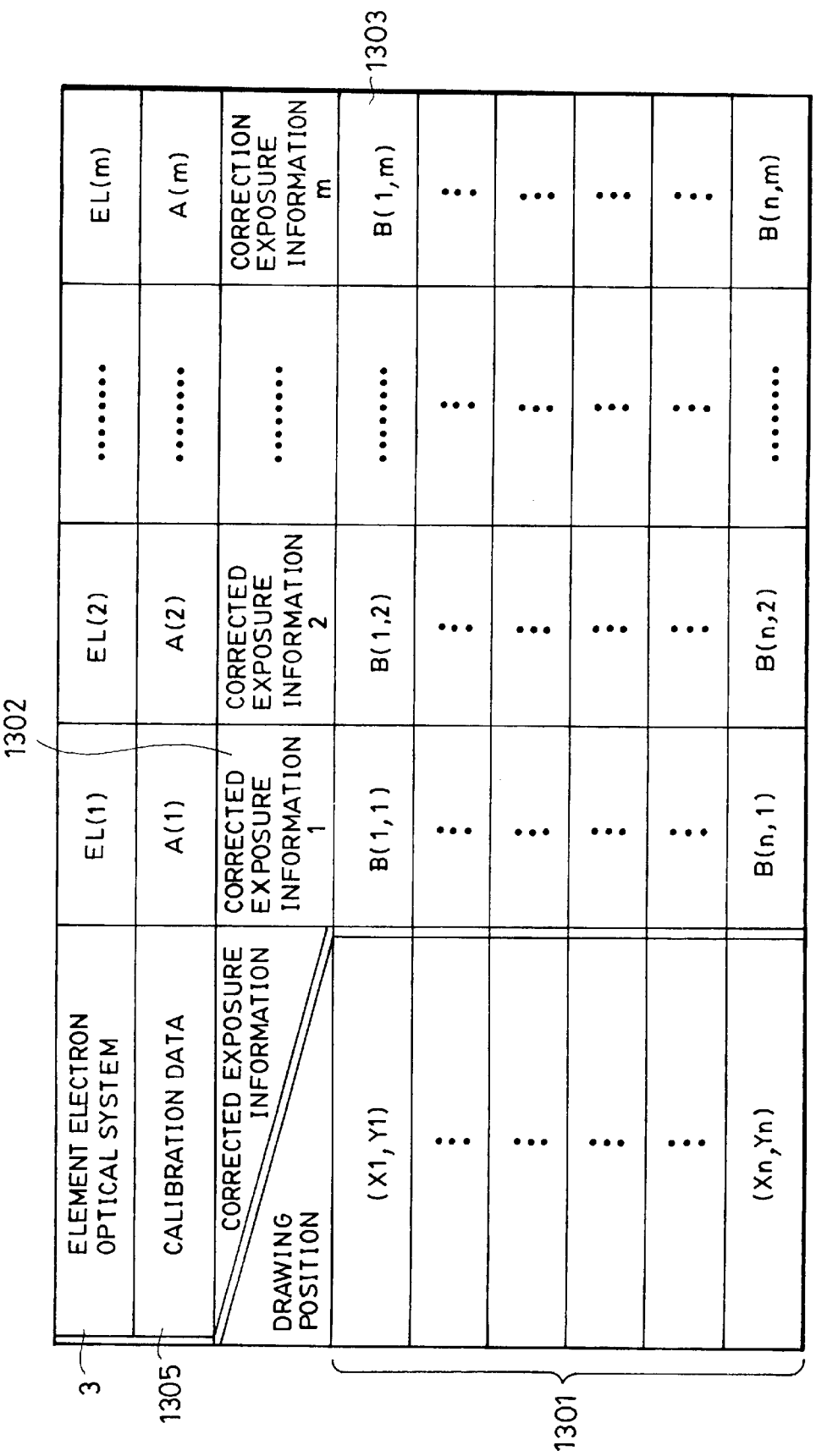
FIG. 13 is a representation showing the relationship of the drawing position with respect to the correction exposure information and the calibration data.

FIG. 13 shows the relationship of the drawing position (Xn, Yn) with respect to the calibration data A(m) and the correction exposure information B(n, m). Here, the drawing position is a coordinate component of the matrix constituting the element exposure field (EF) described with reference to FIG. 8, and is a unit which is subjected to an irradiation by charged particle beams. Reference numeral 1301 denotes the drawing position coordinate represented as a row matrix, and reference numerals 1302 and 1303 are correction exposure information each created under different conditions, and have a one-to-one correspondence with each component of the drawing position. Here, correction exposure information 1 (1302) and correction exposure information m (1303) are information stored in the first correction factor memory 1020 shown in FIG. 10, and the correction exposure information to be set is not common with respect to all element exposure fields (EF). The correction exposure information would be individually selected and set.

Calibration data 1305 is correction data corresponding to each of the elements EL(1), EL(2), . . . , El(m) of the element electron optical system 3, and are stored in the second correction factor memory 1030 shown in FIG. 10.

The calibration data 1305 and the correction exposure information (1302 and 1303) are data different in the cycle of correction during the irradiation of the charged particle beams. In the former one, a correction is performed when the system is activated with respect to the heating generated by the irradiation of the electron beams, or initial mechanical differences in the correction electron optical system 3 adjacent to the exposure system, and the cycle of the correction is one time to several times per day. On the other hand, in the latter one, since correction exposure information is uniquely determined for each drawing position, and a correction is performed for each irradiation position of charged particle beams, the frequency of the correction becomes enormous.

Thus, individually managing data differing in the correction cycle significantly facilitates the maintenance of data, for example, in that necessary data can be exclusively rewritten.

Furthermore, since the control of data using only necessary data can be performed in accordance with the use of correction, a required load of computation processing is reduced.

Figure 14:
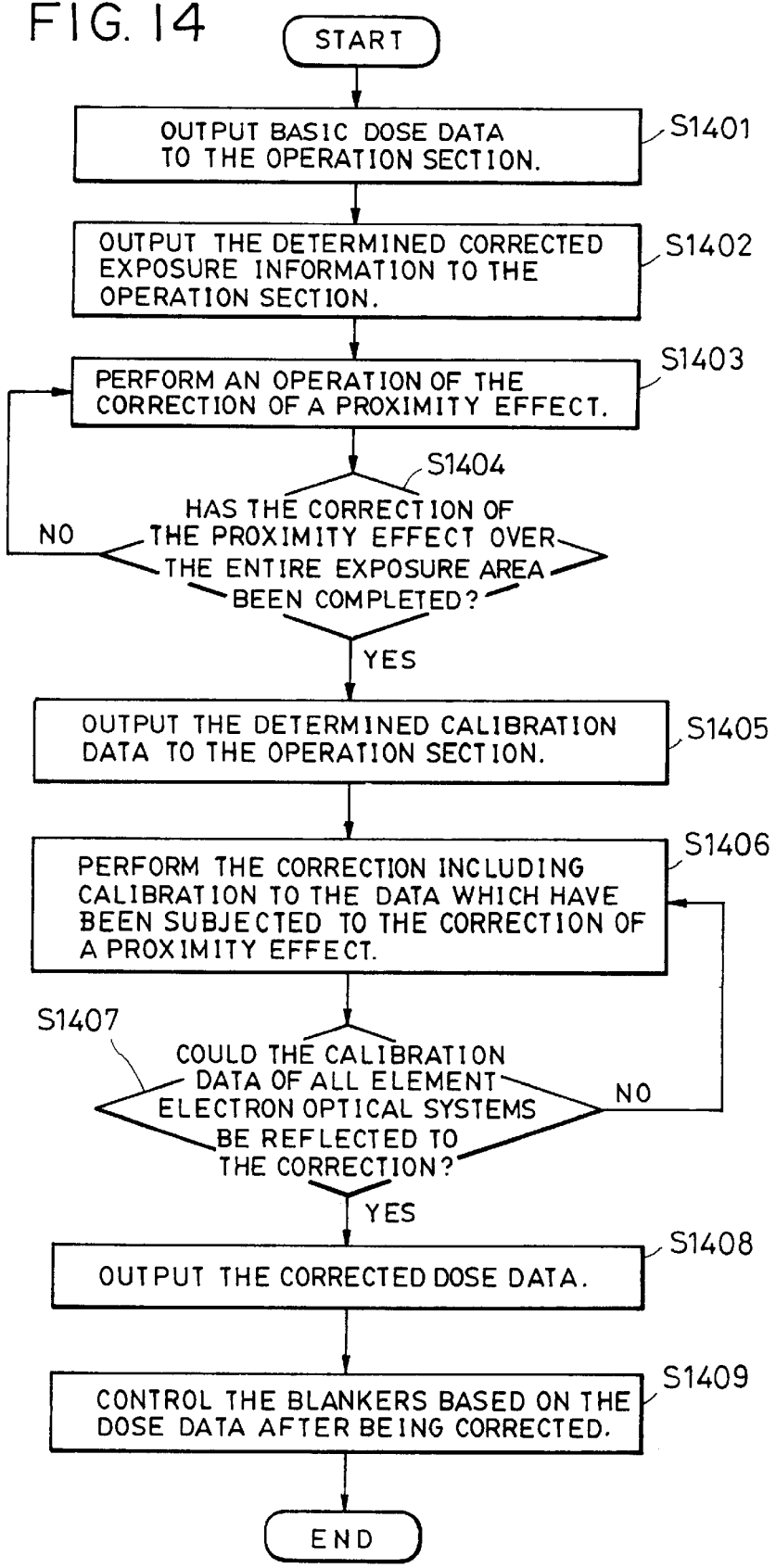
FIG. 14 is a flowchart showing the processing of a data controller and a processing unit.

FIG. 14 is a flowchart showing the processing of a data controller 1040 and a computing element 1050 (FIG. 10). In accordance with this flowchart, a description will be provided of the drawing of a corrected pattern considering the proximity effect correction for each irradiation position and the calibration of each of the element electron optical systems.

The data controller 1040 outputs the standard dose data which is stored in the basic dose data memory 1010 already created, to the computing element 1050 (S1401). Also, the data controller 1040 outputs the correction exposure information established in accordance with the evaluation procedure shown in FIG. 11, to the computing element 1050 (S1402).

The computing element 1050 first performs a proximity effect correction with respect to the standard dose data in accordance with the established correction exposure information (S1403). This correction is a change in duty for controlling the opening/closing of blankers. For example, when the duty of the standard dose data is "1.0", in accordance with the result of the correction, which increases the duty by 20%, the dose data after the correction is "1.2", while in accordance with the result of the correction which decreases the duty by 20%, the dose data after the correction is "0.8".

Next, in step S1404, the computing element 1050 judges whether the proximity effect correction has been completed, and if the processing of the correction has not yet been completed, step S1403 is carried on, while, if the processing of the correction has been completed with respect to all fields to be exposed, the data controller outputs the calibration data of each of the element electron optical systems established in accordance with the procedure shown in FIG. 12, to the computing element 1050 (S1405).

The computing element 1050 performs a correction considering calibration data with respect to data which has completed a proximity effect correction (S1406), and if the calibration data of all of the element electron optical systems is reflected to the correction (S1407-Yes), the processing proceeds to step S1308. If not so (S1407-No), the processing of step S1406 is carried on.

In step S1408, the computing element 1050 outputs corrected dose data, which has been subjected to the proximity effect correction for each irradiation position and the correction for each element electron optical system by calibration data, with respect to the standard dose data, to the drawing dose data memory 1060. Meanwhile, the drawing dose data memory 1060 serves as a kind of buffer, and is not an indispensable element in the embodiments in accordance with the present invention. The computing element 1050, therefore, may output the corrected dose data to the driver 1070. The driver 1070 controls the opening/closing of the blankers in accordance with the corrected dose data (S1409).

In accordance with this embodiment, by selecting the correction exposure information performing a proximity effect correction for each irradiation position, and the calibration information for correcting variations in the irradiation dose among charged particles, it becomes possible to perform an exposure which has been subjected rapidly and appropriately to both corrections.

Moreover, by individually managing data differing in the correction cycle, the maintenance of data is significantly facilitated, for example, in that necessary data can be exclusively rewritten.

Furthermore, since the control of data using only necessary data can be performed in accordance with the use of correction, a required load of the computation processing can be reduced.

[Method for Manufacturing a Device]

Next, a description is given of embodiments of the method for manufacturing a device utilizing the electron beam exposure system 100 in accordance with the above-described embodiments.

Figure 15:
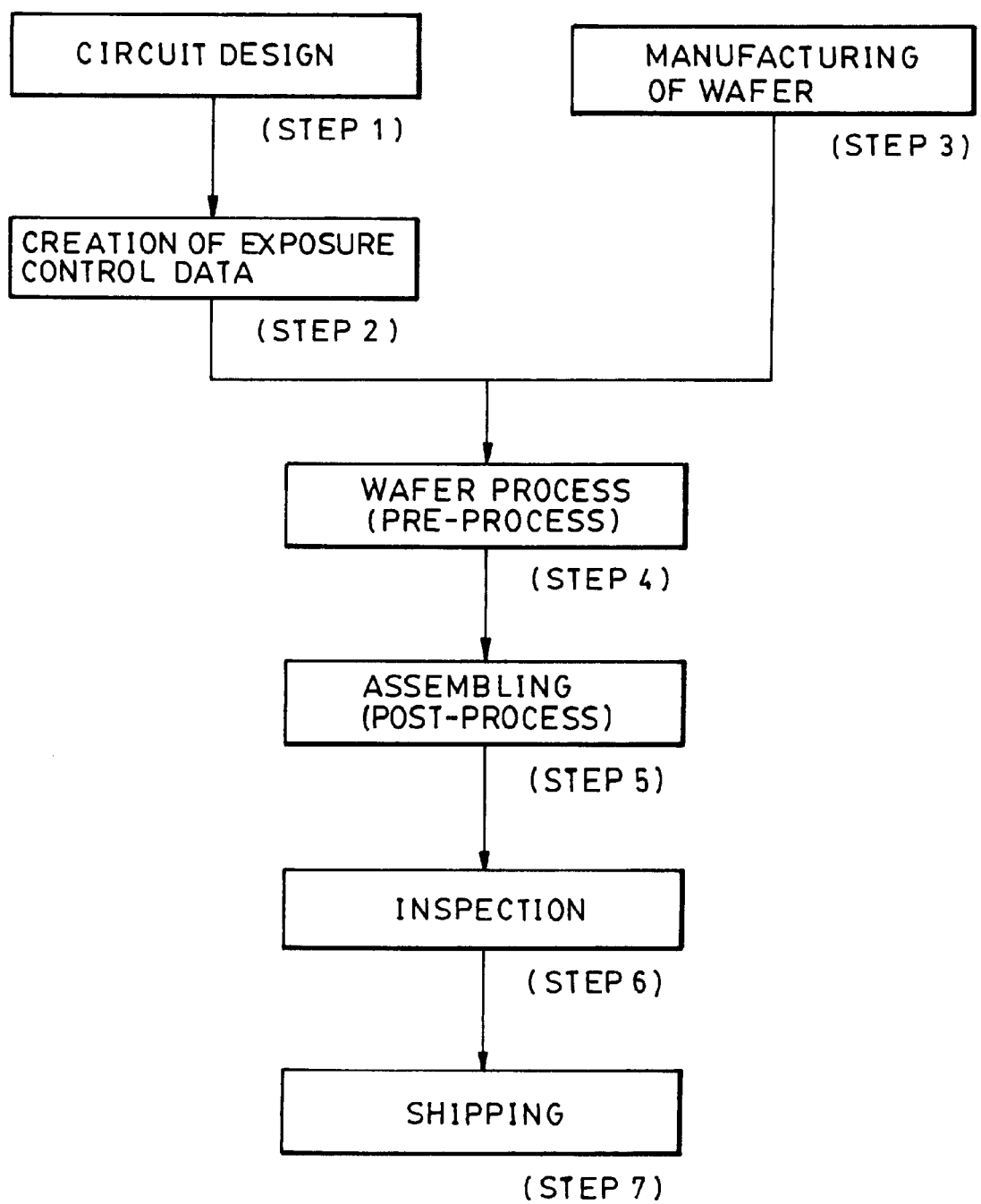
FIG. 15 is a block diagram showing a flowchart of manufacturing a micro device (e.g., a semiconductor chip such as an IC and LSI, a liquid crystal panel, a CCD, a thin-film magnetic head, a micromachine, or the like)

FIG. 15 shows a flowchart of the manufacturing of a micro-device (e.g., a semiconductor chip such as IC and LSI, a liquid crystal panel, a CCD, a thin-film magnetic head, a micromachine, or the like). In step 1 (circuit design), the circuit design of a semiconductor device is performed. In step 2 (the creation of exposure control data), exposure control data for the exposure system is created in the computer 200 based on a circuit pattern. In step 3 (wafer manufacturing), a wafer is manufactured using a material such as silicon. In step 4 (wafer processing), which is referred to as a pre-process, an actual circuit is formed on a wafer by means of lithography, utilizing the electron beam exposure system 100 in which the exposure control data created in step 2 has been inputted. In the next step, step 5 (assembling), which is referred to as a post-process, the wafer manufactured in step 4 is formed into semiconductor chips. This process includes processes such as an assembling process (dicing and bonding) and a packaging process (enclosing of a chip). In step 6 (inspection), inspections such as an operation confirming test and a durability test are performed with respect to the device fabricated in step 5. Through such processes, semiconductor devices are produced, and are shipped (step 7).

Figure 16:
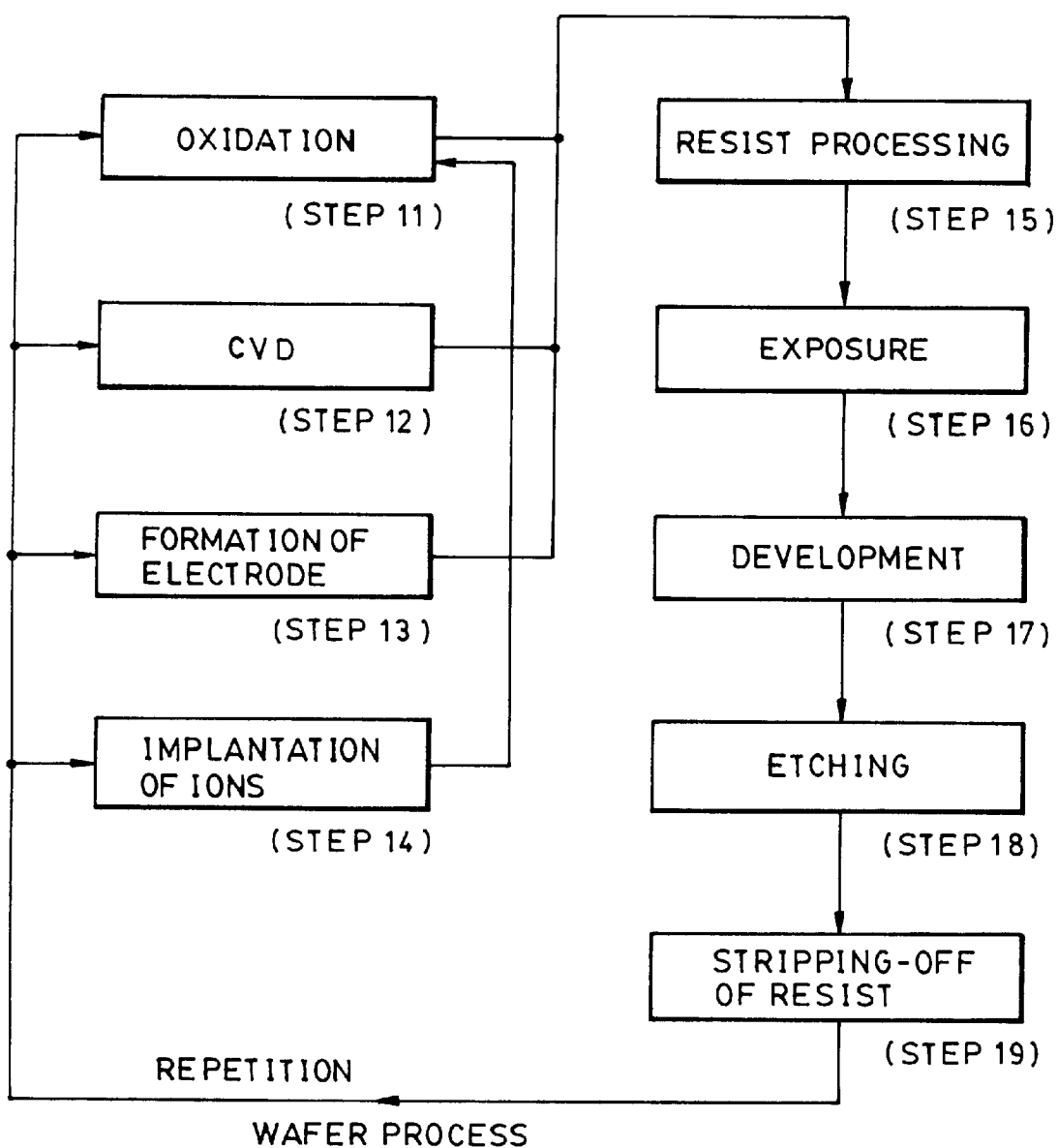
FIG. 16 is a flowchart showing the particular flow of wafer processing in the flowchart shown in FIG. 15.

FIG. 16 is a flowchart showing the particular flow of the wafer processing in the flowchart shown in FIG. 15. In step 11 (oxidation), the surface of the wafer is oxidized. In step 12 (CVD), an insulating film is formed on the surface of the wafer. In step 13 (electrode formation), electrodes are formed on the wafer by deposition. In step 14 (ion implantation), ions are implanted onto the wafer. In step 15 (resist processing), a photosensitive agent is applied over the wafer. In step 16 (exposure), a circuit pattern is exposed and printed on the wafer using the electron beam system 100. In step 17 (development), the exposed wafer is developed. In step 18 (etching), portions except for the developed resist image are removed. In step 19 (stripping-off of resist), the resist, which became unnecessary as etching is over, is removed. By repeating these steps, circuit patterns are multiply formed on the wafer.

In accordance with the present invention, based on the correction exposure information appropriately selected and the calibration information for correcting variations in the irradiation light among charged particle beams, it is possible to expose a pattern on an object to be exposed, while controlling the irradiation light of the charged particle beams. Moreover, by individually managing data differing in the correction cycle, the maintenance of data is significantly facilitated, for example, in that necessary data can be exclusively rewritten. Furthermore, since the control of data using only necessary data can be performed in accordance with the use of correction, a required load of computation processing can be reduced.

Except as otherwise disclosed herein, the various components shown in outline or in block form in the figures are individually well known and their internal construction and operation are not critical either to the making or using of this invention or to a description of the best mode of the invention.

While the present invention has been described with reference to what are presently considered to be the ti preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A charged particle beam exposure system which draws a pattern on an object to be exposed by a plurality of charged particle beams emitted from a plurality of element electron optical systems, said system comprising:
   (a) a storage device storing:
      (i) a standard data for controlling the irradiation duty of each of the plurality of the charged particle beams on each of irradiation positions to the object, depending on the pattern,
      (ii) plural pieces of proximity effect correction data for reducing an influence of a proximity effect, and
      (iii) calibration data for reducing irradiation dose variations among the plurality of the charged particle beams; and
   (b) a computing device for correcting the standard data by one piece of proximity effect correction data, the one piece of proximity effect correction data being selected from the plural pieces of proximity effect correction data in accordance with a condition of the object, on each of the irradiation positions and calibrating the irradiation duty of each of the plurality of the charged particle beams by the calibration data, to generate the drawing data.

2. A charged particle beam exposure system as claimed in claim 1, wherein the standard data includes bit map data which is determined depending on the pattern to be exposed.

3. A charged particle beam exposure system as claimed in claim 2, wherein the standard data includes data defining the bit map data and a ratio of irradiation time with respect to non-irradiation time.

4. A charged particle beam exposure apparatus as claimed in claim 1, further comprising obtaining means for obtaining the calibration data by measuring variations in the irradiation dose among a plurality of the charged particle beams.

5. A charged particle beam exposure apparatus as claimed in claim 4, wherein said obtaining means includes a Faraday cup.

6. A charged particle beam exposure apparatus as claimed in claim 1, further comprising selecting means for selecting the one piece of data suitable for the proximity effect correction with respect to the standard data, from the plural pieces of the proximity effect correction data stored in said storage device.

7. A method for correcting exposure data for drawing a pattern on an object to be exposed by a plurality of charged particle beams emitted from a plurality of element electron optical systems, said method comprising the steps of:

creating a standard dose data for each irradiation position of the charged particle beams in order to expose a standard pattern on the object to be exposed;

creating or renewing a plurality of the proximity effect correction data for each irradiation position, depending on conditions of the object to be exposed;

selecting any one piece of the proximity effect correction data, from plural pieces of the proximity effect correction data for each irradiation position;

performing a proximity effect correction with respect to the standard dose data based on the selected data, and exposing a pattern on the object to be exposed;

evaluating the exposed pattern, and judging whether the selected one piece of proximity effect correction data is the optimum data for controlling the standard dose data;

determining the optimum proximity effect correction data for controlling the standard dose data in accordance with the judgment;

measuring, by a sensor, the irradiation dose of the charged particle beams from each element electron optical system, the irradiation dose having been subjected to a correction by the proximity effect correction data; and determining the calibration data of each of the element electron optical systems, based on the irradiation dose measured in said measuring step.

8. A method for correcting exposure data as claimed in claim 7, wherein whether the selected one piece of proximity effect correction data is the optimum data for controlling the standard dose data is judged by comparing the exposed pattern and the standard pattern by a visual inspection.

9. A method for correcting exposure data as claimed in claim 7, wherein whether the selected one piece of proximity effect correction data is the optimum data for controlling the standard dose data is judged by evaluating means for comparing the exposed pattern and the standard pattern.

10. A method for correcting exposure data as claimed in claim 7, wherein the standard dose data includes bit map data which is determined depending on the pattern to be exposed.

11. A method for correcting exposure data as claimed in claim 7, wherein the standard dose data includes the data defining the bit map data and the ratio of the irradiation time with respect to the non-irradiation time.

12. A method for correcting exposure data as claimed in claim 7, wherein the proximity effect correction data is data not depending on the pattern to be exposed, but depending on the conditions of the object to be exposed.

13. A method for correcting exposure data as claimed in claim 12, wherein the conditions are determined as at least one parameter among the fundamental conditions of the object to be exposed, the resist material, and a backward-scattering radius.

14. A method for correcting exposure data as claimed in claim 7, wherein the sensor in said measuring step includes a Faraday cup.

15. A method for manufacturing a device, comprising the steps of:

providing an exposure system as claimed in claim 1;

exposing a pattern on a wafer using the exposure system; and assembling a device by processing the wafer on which the pattern has been exposed.

* * * * *

UNITED STATES PATENT AND TRADEMARK OFFICE
CERTIFICATE OF CORRECTION

PATENT NO. : 6,835,937 B1
DATED : December 28, 2004
INVENTOR(S) : Masato Muraki et al.

It is certified that error appears in the above-identified patent and that said Letters Patent is hereby corrected as shown below:

Column 1,
Line 59, "$\pi$" should read -- $\eta$ --.

Column 2,
Line 12, "$\pi$," should read -- $\eta$, --.
Line 16, "$\pi$" should read -- $\eta$ --.

Column 7,
Line 46, "$D_{13}$" should read -- $D_\_$ --.

Column 11,
Line 7, the second occurrence of "is referred" should be deleted.
Line 19, "(S110)," should read -- (S1110), --.

Column 14,
Line 37, "ti" should be deleted.
Line 47, "which" should read -- that --.
Line 48, "by" should read -- by irradiating --.
Line 49, "emitted from a plurality of element electron" should be deleted.
Line 50, "optional systems, said system" should read -- to the object based on drawing data, the apparatus --.
Line 51, "device" should read -- device for --
Line 52, "a standard data for controlling the" should read -- standard data, which represents an --.

Column 15,
Lines 3 and 6, "system" should read -- apparatus --.
Line 25, "electron" should be deleted.

UNITED STATES PATENT AND TRADEMARK OFFICE
CERTIFICATE OF CORRECTION

PATENT NO. : 6,835,937 B1
DATED : December 28, 2004
INVENTOR(S) : Masato Muraki et al.

It is certified that error appears in the above-identified patent and that said Letters Patent is hereby corrected as shown below:

Column 16,
Lines 2 and 6, "electron" should be deleted.

Signed and Sealed this

Tenth Day of May, 2005

JON W. DUDAS
*Director of the United States Patent and Trademark Office*